United States Patent [19]
Graf et al.

[11] Patent Number: 5,821,618
[45] Date of Patent: Oct. 13, 1998

[54] SEMICONDUCTOR COMPONENT WITH INSULATING HOUSING

[75] Inventors: Alfons Graf, Kaufering; Peter Huber, Munich; Xaver Schloegel, Sachsenkam; Peter Sommer, Munich, all of Germany

[73] Assignee: Siemens Aktiengesellschaft, Munich, Germany

[21] Appl. No.: 514,771

[22] Filed: Aug. 14, 1995

[30] Foreign Application Priority Data

Aug. 12, 1994 [DE] Germany .......................... 44 28 686.4

[51] Int. Cl.⁶ .......................... H01L 23/34; H01L 29/74; H01L 31/111; H01L 29/861
[52] U.S. Cl. .......................... 257/723; 257/119; 257/150; 257/177; 257/658; 257/925
[58] Field of Search .......................... 257/925, 119, 257/658, 723, 177, 150, 724, 725

[56] References Cited

U.S. PATENT DOCUMENTS

| | | | |
|---|---|---|---|
| 3,411,047 | 11/1968 | Baker et al. | 257/119 |
| 5,043,859 | 8/1991 | Korman et al. | 257/368 |
| 5,391,919 | 2/1995 | Torti et al. | 257/925 |

FOREIGN PATENT DOCUMENTS

| | | | |
|---|---|---|---|
| 56-21355 | 2/1981 | Japan | 257/925 |
| 60-250659 | 12/1985 | Japan | 257/177 |
| 61-225848 | 10/1986 | Japan | 257/119 |

OTHER PUBLICATIONS

Patents Abstracts of Japan, vol. 18, No. 95 (E–1509) Feb. 16, 1994 & JP-A-5-299576 (Mitsubishi) Nov. 12, 1993.
Patents Abstracts of Japan, vol. 14, No. 73 (E–887) Feb. 9, 1990 & JP-A-1-289278 (Mitsubishi) Nov. 21, 1989.

*Primary Examiner*—Teresa M. Arroyo
*Attorney, Agent, or Firm*—Herbert L. Lerner; Laurence A. Greenberg

[57] ABSTRACT

A semiconductor component includes an insulating housing. A plurality of sheet-metal mounting plates are disposed in one and the same plane and are electrically separated from one another in the housing. Semiconductor switches of a rectifier bridge are electrically conductively secured to the mounting plates. Sheet-metal connection leads are electrically connected to the semiconductor switches. At least one sheet-metal connection lead is electrically connected to the mounting plates.

2 Claims, 1 Drawing Sheet

SEMICONDUCTOR COMPONENT WITH INSULATING HOUSING

BACKGROUND OF THE INVENTION

1. Field of the Invention

The invention relates to a semiconductor component having:

a) an insulating housing or package, b) a sheet-metal mounting plate disposed in the housing, c) at least one semiconductor body which is electrically conductively secured to the mounting plate, d) sheet-metal connection leads that are electrically connected to the semiconductor body, and e) at least one sheet-metal connection lead that is electrically connected to the mounting plate.

Semiconductor components with such housings or packages are known. Notable types of such housing forms include the DIL (dual in-line) housing and the P-DSO (plastic dual small outline) housing. The first of them is usable for normal mounting, and the second can be used for surface mounting (SMD) on printed circuit boards,. Such housings contain a mounting plate of sheet steel and connection leads of sheet metal, which are electrically connected to the mounting plate, or to the components secured to the mounting plate. The mounting plate and the connection leads are cut from a leadframe. The disadvantage thereof is that all of the components secured to the mounting plate have the same potential, unless the semiconductor components are electrically insulated from the mounting plate by insulating layers. Bridge circuits are therefore not readily possible.

2. Summary of the Invention

It is accordingly an object of the invention to provide a semiconductor component with an insulating housing, which overcomes the hereinafore-mentioned disadvantages of the heretofore-known devices of this general type and which permits bridge circuits to be provided at little expense.

With the foregoing and other objects in view there is provided, in accordance with the invention, a semiconductor component, comprising an insulating housing; a plurality of sheet-metal mounting plates being disposed in one and the same plane and being electrically separated from one another in the housing; semiconductor switches of a rectifier bridge being electrically conductively secured to the mounting plates; sheet-metal connection leads being electrically connected to the semiconductor switches; and at least one sheet-metal connection lead being electrically connected to the mounting plates.

In accordance with another feature of the invention, the plurality of mounting plates includes two mounting plates, and the semiconductor switches are two semiconductor switches each being disposed an a respective one of the mounting plates.

In accordance with a further feature of the invention, the plurality of mounting plates includes three mounting plates, the semiconductor switches include four semiconductor switches, two of the semiconductor switches are disposed on one of the mounting plates, and one of the semiconductor switches is disposed on each of the other mounting plates.

In accordance with an added feature of the invention, the mounting plates and the connection leads are cut from a single leadframe.

In accordance with a concomitant feature of the invention, the housing is block-shaped and has long sides, and the connection leads protrude from the long sides of the housing.

Other features which are considered as characteristic for the invention are set forth in the appended claims.

Although the invention is illustrated and described herein as embodied in a semiconductor component with an insulating housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
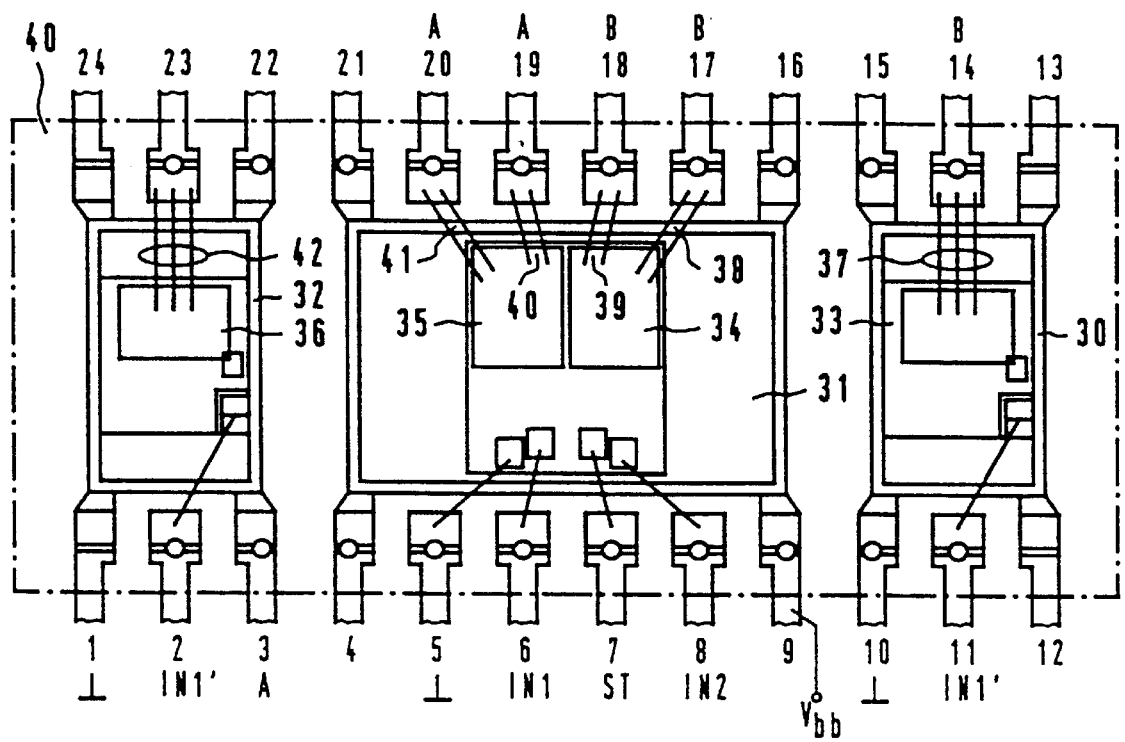
FIG. 1 is a fragmentary, diagrammatic, plan view of a lead system of a rectifier bridge.

Referring now to the figures of the drawing in detail and first, particularly, to FIG. 1 thereof, there is seen a rectifier bridge which in accommodated in a fully insulated plastic housing or package 40. An outer periphery of the housing 40 is represented diagrammatically in phantom by dot-dash lines. The housing is or the P-DSO-24 type, for example, with 24 connection leads identified by reference numerals 1–24. The housing contains three mounting plates 30, 31 and 32. The mounting plate 30 is connected to the connection leads 10, 11, 13, 15, the mounting plate 31 is connected to the connection leads 4, 9, 16, 21, and the mounting plate 32 is connected to the connection leads 1, 3, 22, 24. A semiconductor switch 33 is disposed on the mounting plate 30, semiconductor switches 34 and 35 are disposed on the mounting plate 31, and a semiconductor switch 36 is disposed on the mounting plate 32. The semiconductor switches are fixed to the mounting plates, for instance by soldering or by conductive adhesive and are thereby electrically conductively connected to them.

The semiconductor switches 33–36 have sides facing away from the mounting plates 30–32 which are connected by bonding wires 37–42 to further connection leads 14, 17–20, 23 that have no electrical connection with the mounting plates.

Figure 2:
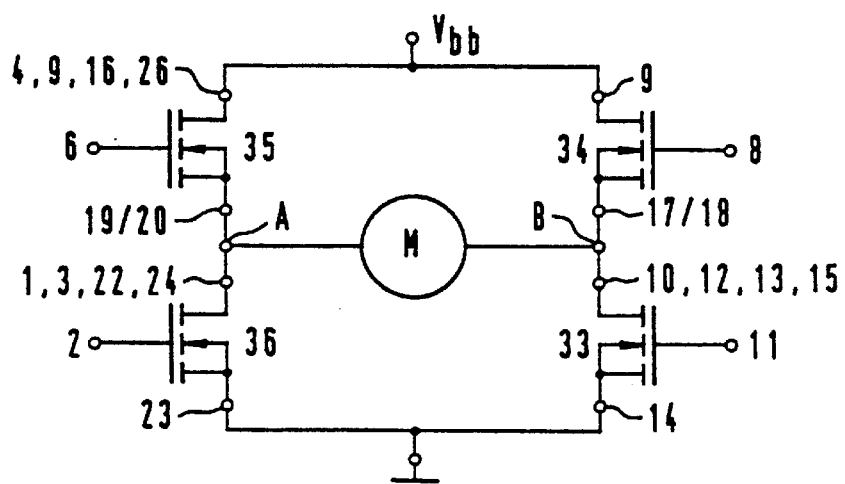
FIG. 2 is a schematic circuit diagram of a full bridge, which can be provided in a simple way using the lead system of FIG. 1.

The semiconductor switches may, for example, be MOS transistors. If one MOS transistor is disposed on each of the mounting plates 30, 32, and two MOS transistors are disposed on the mounting plate 31, then a controlled full bridge can be provided in a simple way. The circuit diagram for such a full bridge is shown in FIG. 2. The corresponding parts of the circuit of FIG. 2 carry the same reference numerals as the mechanical counterparts of FIG. 1. Connections of the load are indicated by reference symbols A and B. Corresponding designations A are also provided for the terminals 3, 19, 20 and corresponding designations B are provided for the terminals 14, 17, 18. These terminals can each be connected to one another internally by bonding wires or by leads located outside the housing.

In the case of the full bridge described, three mounting plates are needed, if the MOSFET bridge of the same channel type, preferably an n-channel MOSFET, is to be used in upper and lower halves of the bridge, because in that type of MOSFET, the positive terminal is always located on the back side of the chip.

In the case of a half bridge, it is sufficient to provide two mounting plates, which are electrically separated from one another, in the housing.

The switches 34, 35, for example, or all of the switches 33–36, may be constructed as smart ICs, rather than as simple controllable switches. In these ICs, such necessary control functions as overtemperature, shutoff, current overload shutoff, and status report are provided.

The mounting plates 30, 31 and 32 are located in one and the same plane and are punched out of single lead frames made of sheet metal. Sheet-metal webs which are present between the connection leads are not removed until after the extruded sheathing is provided. The result is a block-shaped housing in which the connection leads protrude from the housing on the long sides.

We claim:

1. A semiconductor component, comprising:
   a) a block shaped insulating housing having relatively longer and relatively shorter sides;
   b) a plurality of sheet-metal mounting plates disposed in one and the same plane, electrically separated from one another in said housing, and punched out of a single lead frame made of sheet metal;
   c) controllable semiconductor switches of a full bridge electrically conductively secured to said mounting plates;
   d) sheet-metal connection leads electrically connected to said semiconductor switches; and
   e) at least one sheet-metal connection lead electrically connected to said mounting plates;
   said connection leads protruding from said relatively longer sides of said housing, said plurality of mounting plates including a first, a second and a third mounting plate, said semiconductor switches including four semiconductor switches, two of said semiconductor switches being disposed on said first mounting plate, another of said semiconductor switches being disposed on said second mounting plate, and a further of said semiconductor switches being disposed on said third mounting plate, and said semiconductor switches being integrated circuits.

2. The semiconductor component according to claim 1, wherein said mounting plates and said connection leads are cut from a single leadframe.

* * * * *